United States Patent
Shah et al.

(10) Patent No.: US 9,024,658 B2
(45) Date of Patent: May 5, 2015

(54) CIRCUIT AND LAYOUT TECHNIQUES FOR FLOP TRAY AREA AND POWER OTIMIZATION

(71) Applicant: QUALCOMM Incorporated, San Diego, CA (US)

(72) Inventors: Jay Madhukar Shah, Bangalore (IN); Chethan Swamynathan, Bangalore (IN); Animesh Datta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 23 days.

(21) Appl. No.: 13/905,060

(22) Filed: May 29, 2013

(65) Prior Publication Data

US 2014/0359385 A1     Dec. 4, 2014

(51) Int. Cl.
*H03K 19/02* (2006.01)
*G01R 31/3177* (2006.01)

(52) U.S. Cl.
CPC .................................. *G01R 31/3177* (2013.01)

(58) Field of Classification Search
USPC ...................................... 326/56–58, 112–113
See application file for complete search history.

(56) References Cited

U.S. PATENT DOCUMENTS

| | | | |
|---|---|---|---|
| 5,444,404 A | 8/1995 | Ebzery | |
| 5,689,517 A * | 11/1997 | Ruparel | 714/731 |
| 5,719,878 A | 2/1998 | Yu et al. | |
| 5,784,384 A * | 7/1998 | Maeno | 714/726 |
| 6,289,477 B1 * | 9/2001 | Gunadisastra | 714/724 |
| 6,420,894 B1 | 7/2002 | Dai et al. | |
| 6,708,303 B1 | 3/2004 | Gallia | |
| 7,237,164 B1 | 6/2007 | Katchmart | |
| 7,543,205 B2 * | 6/2009 | Abhishek | 714/726 |
| 7,590,900 B2 | 9/2009 | Kim et al. | |
| 8,421,513 B2 * | 4/2013 | Pal | 327/202 |

(Continued)

FOREIGN PATENT DOCUMENTS

JP        11094914 A      4/1999

OTHER PUBLICATIONS http://www.eng.utah.edu/~cs6710/handouts/AppendixB/appendixB.doc4.html.*

(Continued)

*Primary Examiner* — Jason M Crawford

(74) *Attorney, Agent, or Firm* — Novak Druce Connolly Bove + Quigg LLP

(57) ABSTRACT

Techniques for reducing scan overhead in a scannable flop tray are described herein. In one embodiment, a scan circuit for a flop tray comprises a tri-state circuit configured to invert an input data signal and output the inverted data signal to an input of a flip-flop of the flop tray in a normal mode, and to block the data signal from the input of the flip-flop in a scan mode. The scan circuit also comprises a pass gate configured to pass a scan signal to the input of the flip-flop in the scan mode, and to block the scan signal from the input of the flip-flop in the normal mode.

26 Claims, 6 Drawing Sheets

(56) References Cited

U.S. PATENT DOCUMENTS

| | | | |
|---|---|---|---|
| 2005/0280459 A1* | 12/2005 | Inoue | 327/203 |
| 2006/0085707 A1* | 4/2006 | Khan et al. | 714/726 |
| 2007/0001728 A1* | 1/2007 | Branch et al. | 327/202 |
| 2008/0016417 A1 | 1/2008 | Sinha et al. | |
| 2008/0284480 A1 | 11/2008 | Ahmadi | |
| 2011/0181331 A1* | 7/2011 | Srivastava et al. | 327/215 |
| 2012/0013379 A1* | 1/2012 | Su et al. | 327/212 |
| 2012/0146697 A1* | 6/2012 | Leach et al. | 327/202 |
| 2013/0002298 A1* | 1/2013 | Howard et al. | 326/56 |
| 2013/0173977 A1* | 7/2013 | Gurumurthy et al. | 714/726 |
| 2014/0040688 A1* | 2/2014 | Zhang et al. | 714/727 |
| 2014/0211893 A1* | 7/2014 | Rasouli et al. | 375/354 |

OTHER PUBLICATIONS http://www2.elo.utfsm.cl/~lsb/elo211/aplicaciones/katz/chapter4/chapter04.doc2.html.*

International Search Report and Written Opinion—PCT/US2014/039856—ISA/EPO—Sep. 15, 2014, and Written Opinion of the International Searching Authority.

* cited by examiner

CIRCUIT AND LAYOUT TECHNIQUES FOR
FLOP TRAY AREA AND POWER
OTIMIZATION

BACKGROUND

1. Field

Aspects of the present disclosure relate generally to scannable flop trays, and more particularly, to reducing the scan overhead of a scannable flop tray.

2. Background

Flip-flops may be used in a system to capture (latch) data values from one or more data signals for processing by various components of the system. The system may include scan circuitry to verify that the flip-flops are functioning correctly during testing. To do this, the scan circuitry receives a scan signal having a known test pattern, and scans the scan signal through the flip-flops. After the scan signal has been scanned through the flip-flops, the output scan signal is compared with an expected output scan signal to determine whether the flip-flops are functioning correctly. The expected output scan signal may be based on the known test pattern of the input scan signal and the expected functionality of the flip-flops. The scan circuitry adds overhead to the system due to the chip area and/or power consumed by the scan circuitry.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a scan circuit for a flop tray is provided. The scan circuit comprises a tri-state circuit configured to invert an input data signal and output the inverted data signal to an input of a flip-flop of the flop tray in a normal mode, and to block the data signal from the input of the flip-flop in a scan mode. The scan circuit also comprises a pass gate configured to pass a scan signal to the input of the flip-flop in the scan mode, and to block the scan signal from the input of the flip-flop in the normal mode.

A second aspect relates to a scan circuit for a flop tray. The scan circuit comprises a first tri-state circuit configured to invert a first data signal and output the inverted first data signal to an input of a first flip-flop of the flop tray in a normal mode, and to block the first data signal from the input of the first flip-flop in a scan mode. The scan circuit also comprises a first pass gate configured to pass a scan signal to the input of the first flip-flop in the scan mode, and to block the scan signal from the input of the first flip-flop in the normal mode. The scan circuit also comprises a second tri-state circuit configured to invert a second data signal and output the inverted second data signal to an input of a second flip-flop of the flop tray in the normal mode, and to block the second data signal from the input of the second flip-flop in the scan mode. The circuit further comprises a second pass gate configured to pass the scan signal from an output of the first flip-flop to the input of the second flip-flop in the scan mode, and to block the scan signal from the output of the first flip-flop from the input of the second flip-flop in the normal mode.

A third aspect relates to a method for scanning a flop tray. The method comprises inverting an input data signal and outputting the inverted data signal to an input of a flip-flop of the flop tray in a normal mode using a tri-state circuit, and blocking the data signal from the input of the flip-flop in a scan mode using the tri-state circuit. The method also comprises passing a scan signal to the input of the flip-flop in the scan mode using a pass gate, and blocking the scan signal from the input of the flip-flop in the normal mode using the pass gate.

A fourth aspect relates to an apparatus for scanning a flop tray. The apparatus comprises means for inverting an input data signal and outputting the inverted data signal to an input of a flip-flop of the flop tray in a normal mode, and means for blocking the data signal from the input of the flip-flop in a scan mode. The apparatus also comprises means for passing a scan signal to the input of the flip-flop in the scan mode, and means for blocking the scan signal from the input of the flip-flop in the normal mode.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
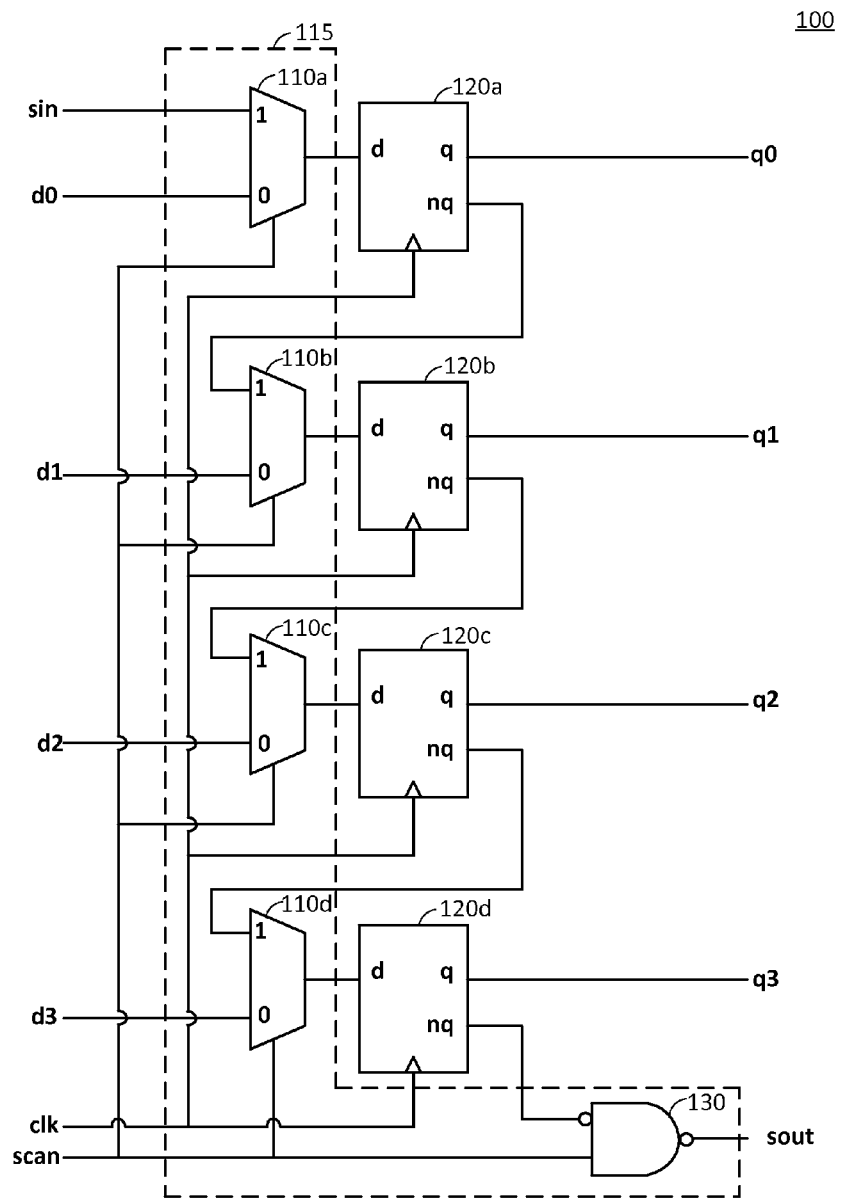
FIG. 1 shows an example of a scannable flop tray.

FIG. 1 shows an example of a scannable flop tray 100. The flop tray 100 can operate in a normal mode or a scan mode. The flop tray 100 is operated in the scan mode during testing to test the correct functionality of the flop tray 100.

The flop tray 100 comprises a first D flip-flop 120a, a second D flip-flop 120b, a third D flip-flop 120c, a fourth D flip-flop 120d, and scan circuitry 115. The scan circuitry 115 is used to operate the flop tray 100 in the scan mode during testing, as discussed further below. The scan circuitry 115 comprises a first scan multiplexer 110a, a second scan multiplexer 110b, a third scan multiplexer 110c, a fourth scan multiplexer 110*d*, and an inverted-polarity NAND gate 130. Each scan multiplexer 110*a*-110*d* is coupled to a respective one of the D flip-flops 120*a*-120*d*, in which the first scan multiplexer 110*a* is coupled to the input of the first D flip-flop 120*a*, the second scan multiplexer 110*b* is coupled to the input of the second D flip-flop 120*b*, and so forth. The scan circuitry 115 constitutes the scan overhead of the flop tray 100.

In the normal mode, the flop tray 100 receives a plurality of data signals d0-d3 in parallel. Each scan multiplexer 110*a*-110*d* receives one of the parallel data signals d0-d3 at a data input (labeled "0" in FIG. 1), and passes the respective data signal d0-d3 to the input of the respective D flip-flop 120*a*-120*d*. Each D flip-flop 120*a*-120*d* captures a data value (e.g., a bit) from the respective data signal d0-d3 on a rising or falling edge of a clock signal clk, and outputs the captured data value q0-q3. Thus, during each clock cycle, the flop tray 100 captures a plurality of data values (e.g., bits) in parallel from the data signals d0-d3 on a rising or falling edge of the clock signal clk, and outputs the captured data values q0-q3 in parallel. FIG. 1 shows an example of a four-bit flop tray comprising four flip-flops. However, it is to be appreciated that the present disclosure is not limited to this example, and can be applied to a flop tray comprising any number of flip-flops.

In the scan mode, the first scan multiplexer 110*a* couples a scan input of the flop tray 100 (labeled "sin" in FIG. 1) to the input of the first flip-flop 120*a*. Each of the remaining scan multiplexers 110*b*-110*d* couples the nq output of the previous D flip-flop to the input of the respective D flip-flop. For instance, the second scan multiplexer 110*b* couples the nq output of the first D flip-flop 120*a* to the input of the second D flip-flop 120*b*, the third multiplexer 110*c* couples the nq output of the second D flip-flop 120*b* to the input of the third D flip-flop 120*c*, and so forth. The scan input of each multiplexer is labeled "1" in FIG. 1. The nq output of the fourth D flip-flop 120*d* (last flip-flop) is coupled to an inverting input of the NAND gate 130. As a result, when a scan signal is input to the flop tray 100 at the scan input ("sin"), the scan signal propagates sequentially through the D flip-flops 120*a*-120*d* of the flop tray 100. The scan signal is finally output at the output of the NAND gate 130 (labeled "sout"). The output scan signal may be inverted or non-inverted relative to the input scan signal depending on the number of inversions in the scan path from the scan input ("sin") of the flop tray 100 to the scan output ("sout").

Thus, in the scan mode, a scan signal is scanned through the D flip-flops 120*a*-120*d* of the flop tray 100. The scan signal may comprise a known test pattern, and the functionality of the flop tray 100 may be evaluated by comparing the output scan signal from the flop tray 100 with an expected output scan signal based on the known test pattern.

In the example shown in FIG. 1, the operating mode of the flop tray 100 is controlled by a scan mode signal received at a scan mode input (labeled "scan" in FIG. 1). The scan mode signal is input to each scan multiplexer 110*a*-110*d* to control whether the scan multiplexer couples the respective input data signal or scan signal to the respective flip-flop. For example, when the scan mode signal is logic zero, each scan multiplexer 110*a*-110*d* couples the respective input data signal to the respective flip-flop. Thus, the flop tray operates in the normal mode when the scan mode signal is zero. When the scan mode signal is logic one, each scan multiplexer 110*a*-110*d* couples the scan signal to the respective flip-flop. Thus, the flop tray operates in the scan mode when the scan mode signal is one. The scan mode signal may also be coupled to a non-inverting input of the NAND gate 130, as shown in FIG. 1. When the scan mode signal is zero (normal mode), the output of the NAND gate 130 is fixed at one.

Figure 2:
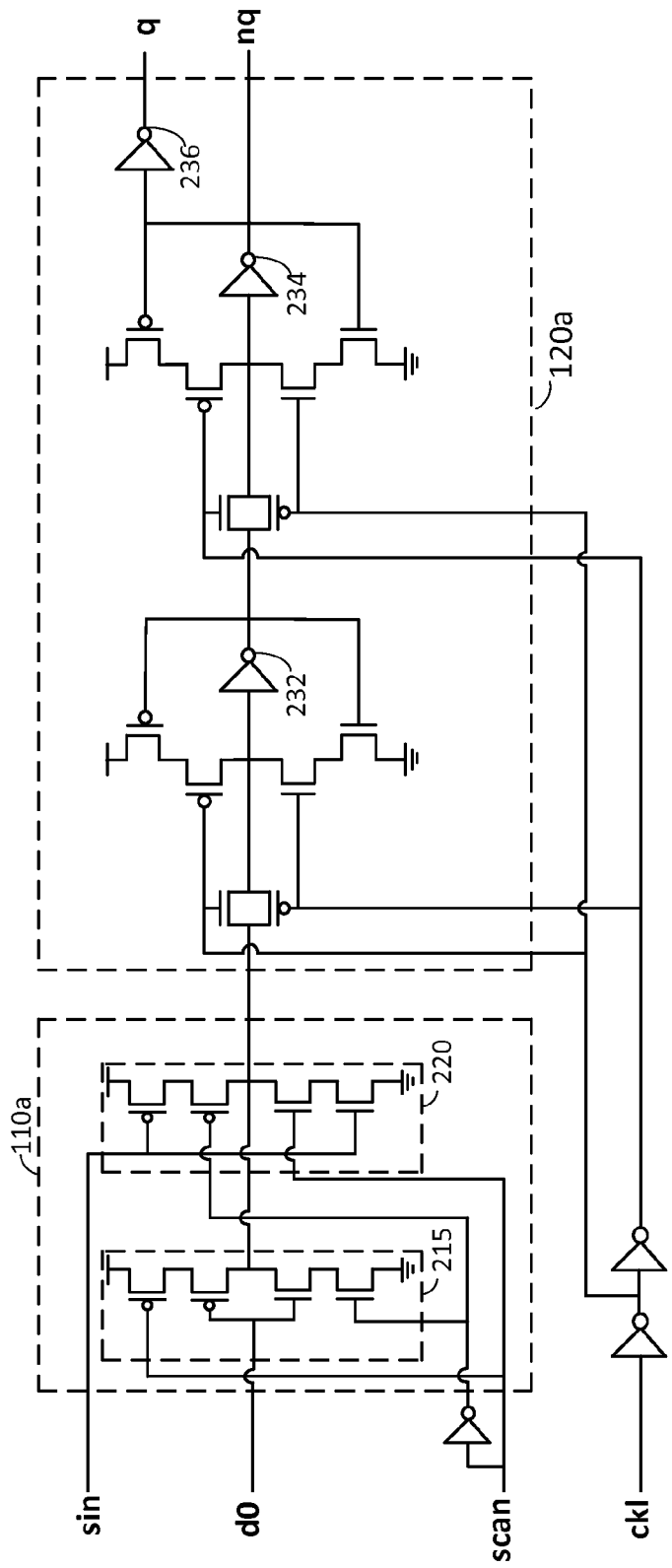
FIG. 2 shows an example of a multiplexer.

FIG. 2 shows an exemplary implementation of the first scan multiplexer 110*a* and the first D flip-flip 120*a*. The first scan multiplexer 110*a* comprises a first tri-state circuit 215 and a second tri-state circuit 220, in which each tri-state circuit includes four transistors (e.g., metal-oxide-semiconductor (MOS) transistors). The first and second tri-state circuits 215 and 220 are controlled by the scan mode signal received at the scan mode input (labeled "scan" in FIG. 2). The tri-state circuits 215 and 220 operate in the normal mode when the scan mode signal is zero, and operate in the scan mode when the scan mode signal is one.

When the scan mode signal is zero, the first tri-state circuit 215 inverts the respective input data signal, and the second tri-state circuit 220 passes the inverted data signal to the input of the respective D flip-flop 120*a*. In the example in FIG. 2, the D flip-flop 120*a* has an odd number of inverters (i.e., inverters 232, 234 and 236) between its input and q output. The odd number of inverters undoes the logical inversion by the first tri-state circuit 215. As a result, there is no logical inversion from the data input of the multiplexer 110*a* to the q output of the D flip-flop 120*a*.

When the scan mode signal is one, the first tri-state circuit 215 blocks the respective data input. The second tri-state circuit 220 inverts the respective input scan signal, and inputs the inverted scan signal to the respective D flip-flop 120*a*. In the example in FIG. 2, the D flip-flop 120*a* has an even number of inverters (i.e., inverters 232 and 234) between its input and nq output. As a result, there is a logical inversion from the scan input of the multiplexer 110*a* to the nq output of the D flip-flop 120*a*.

Thus, in the normal mode, the scan multiplexer 110*a* in FIG. 2 inverts the input data signal before outputting the data signal to the respective flip-flop 120*a*. In the scan mode, the scan multiplexer 110*a* inverts the input scan signal before outputting the scan signal to the respective flip-flop 120*a*. Thus, the scan multiplexer 110*a* in FIG. 2 is an example of an inverting multiplexer.

Each of the remaining scan multiplexers 110*b*-110*d* in the flop tray 100 can also be implemented using the circuit shown in FIG. 2. For each of the remaining scan multiplexers 110*b*-110*d*, the scan input of the multiplexer (labeled "1" in FIG. 1) is coupled to the nq output of the previous D flip-flop 120*a*-120*c*.

The transistors making up the first and second tri-state circuits 215 and 220 of each scan multiplexer 110*a*-110*d* take up chip area and consume power. Accordingly, it is desirable to reduce the number of transistors in the multiplexers in order to reduce the area and/or power consumption of the scan circuitry 115.

Figure 3:
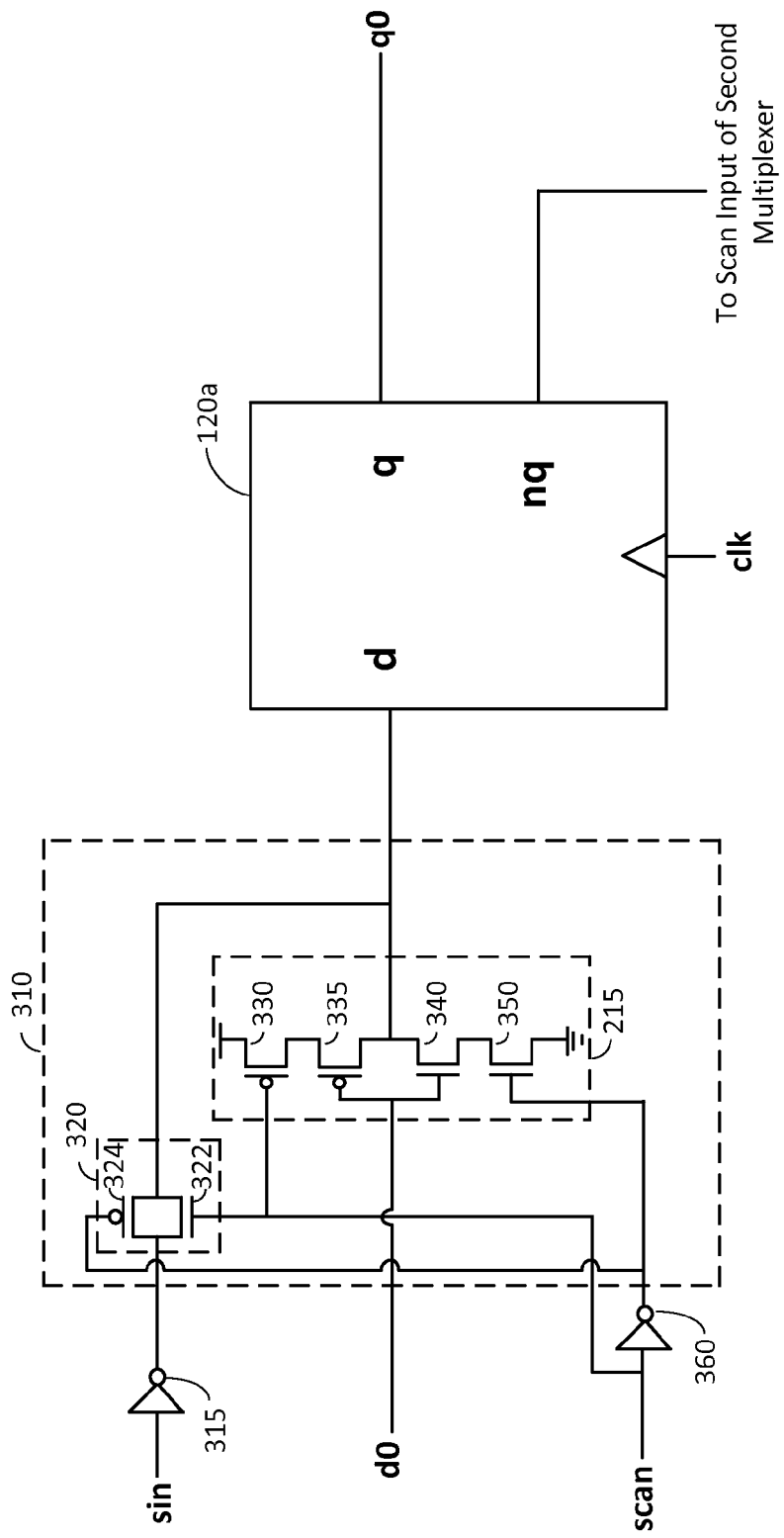
FIG. 3 shows a scan multiplexer with reduced overhead according to an embodiment of the present disclosure.

FIG. 3 shows a scan multiplexer 310 according to an embodiment of the present disclosure. FIG. 3 shows an example in which the scan multiplexer 310 is used to implement the first scan multiplexer in a flop tray, which is coupled between the scan input ("sin") of the flop tray and the first flip-flop 120*a* of the flop tray. An example of a flop tray including scan multiplexers implemented using the scan multiplexer 310 shown in FIG. 3 is discussed below with reference to FIG. 5.

In the scan multiplexer 310, the second tri-state circuit 220 in the scan multiplexer 110*a* shown in FIG. 2 is replaced by a pass gate 320. The pass gate 320 comprises two transistors compared with four transistors for the second tri-state circuit 220, resulting in a reduction of two transistors in the scan multiplexer 310. In the example shown in FIG. 3, the pass gate 320 comprises an n-type transistor 322 and a p-type transistor 324 coupled in parallel, in which the gate of the n-type transistor 322 is coupled to the scan mode input ("scan") and the gate of the p-type transistor 324 is coupled to the scan mode input ("scan") through a scan mode inverter 360. Thus, the gate of the n-type transistor 322 is driven by the scan mode signal and the gate of the p-type transistor 324 is driven by the inverse of the scan mode signal. Both transistors 322 and 324 are turned on in the scan mode and both transistors 322 and 324 are turned off in the normal mode.

When the scan mode signal is zero (normal mode), the first tri-state circuit 215 inverts the input data signal, and outputs the inverted data signal to the input of the first flip-flop 120a of the flop tray. The first tri-state circuit 215 is described in more detail below. The pass gate 320 blocks the input scan signal from the input of the first D flip-flop 120a. Thus, in the normal mode, the scan multiplexer 310 is functionally equivalent to the first scan multiplexer 110a shown in FIG. 2.

When the scan mode signal is one (scan mode), the first tri-state circuit 215 blocks the input data signal from the input of the first D flip-flop 120a. The pass gate 320 passes the input scan signal to the input of the first D flip-flop 120a. In the scan mode, the pass gate 320 does not invert the input scan signal unlike the second tri-state circuit 220 in the first multiplexer 110a shown in FIG. 2. Thus, in the scan mode, the scan multiplexer 310 passes the scan signal to the first flip-flop 120a without inversion.

In one embodiment, an inverter 315 may be coupled between the scan input ("sin") of the flop tray and the scan multiplexer 310 to invert the scan signal prior to being input to the scan multiplexer 310. Thus, the combination of the inverter 315 and the pass gate 320 in the scan multiplexer 310 may be functionally equivalent to the second tri-state circuit 220 shown in FIG. 2.

Each of the remaining scan multiplexers in the flop tray can also be implemented using the multiplexer 310 shown in FIG. 3. For each of the remaining scan multiplexers, the input of the pass gate 320 may be coupled to the nq output of the previous D flip-flop without an intervening inverter.

Figure 4:
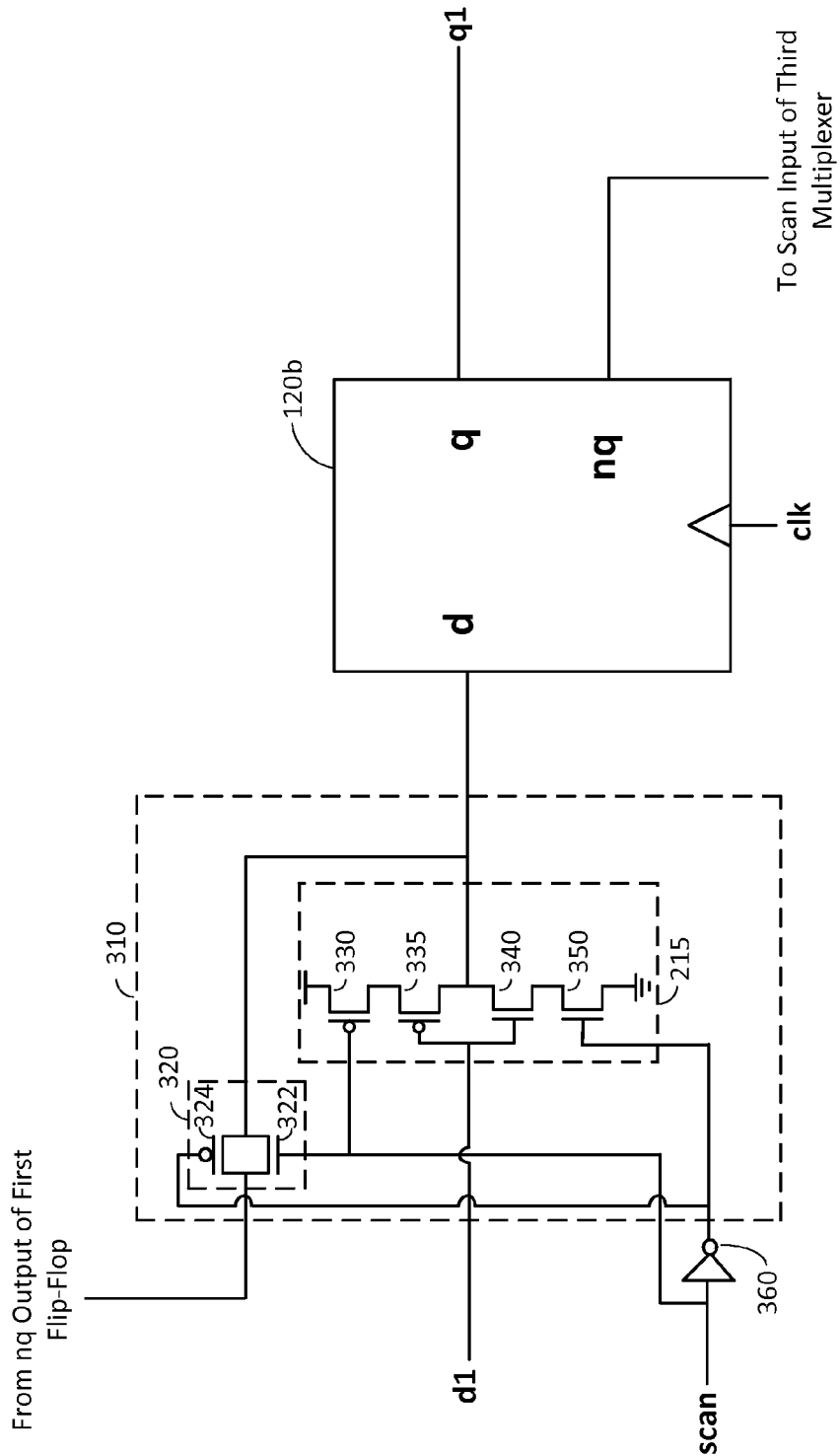
FIG. 4 shows a scan multiplexer coupled between an output of one flip-flop and an input of another flip-flop according to an embodiment of the present disclosure.

In this regard, FIG. 4 shows an example in which the scan multiplexer 310 is used to implement the second scan multiplexer in a flop tray. In this example, the pass gate 320 is coupled to the nq output of the first D flip-flop 120a (shown in FIG. 3) without an intervening inverter. As discussed above, the pass gate 320 replaces the second tri-state circuit 220 shown in FIG. 2, resulting in a reduction of two transistors in the multiplexer 310.

When the scan mode signal is zero (normal mode), the first tri-state circuit 215 inverts the input data signal, and outputs the inverted data signal to the input of the second D flip-flop 120b of the flop tray. The pass gate 320 blocks the scan signal from the input of the second D flip-flop 120b.

When the scan mode signal is one (scan mode), the first tri-state circuit 215 blocks the input data signal from the input of the second D flip-flop 120b. The pass gate 320 passes the scan signal from the nq output of the first D flip-flop 120a (shown in FIG. 3) to the input of the second D flip-flop 120b. The scan signal from the nq output of the second D flip-flop 120b is coupled to the third scan multiplexer in the flop tray.

Figure 5:
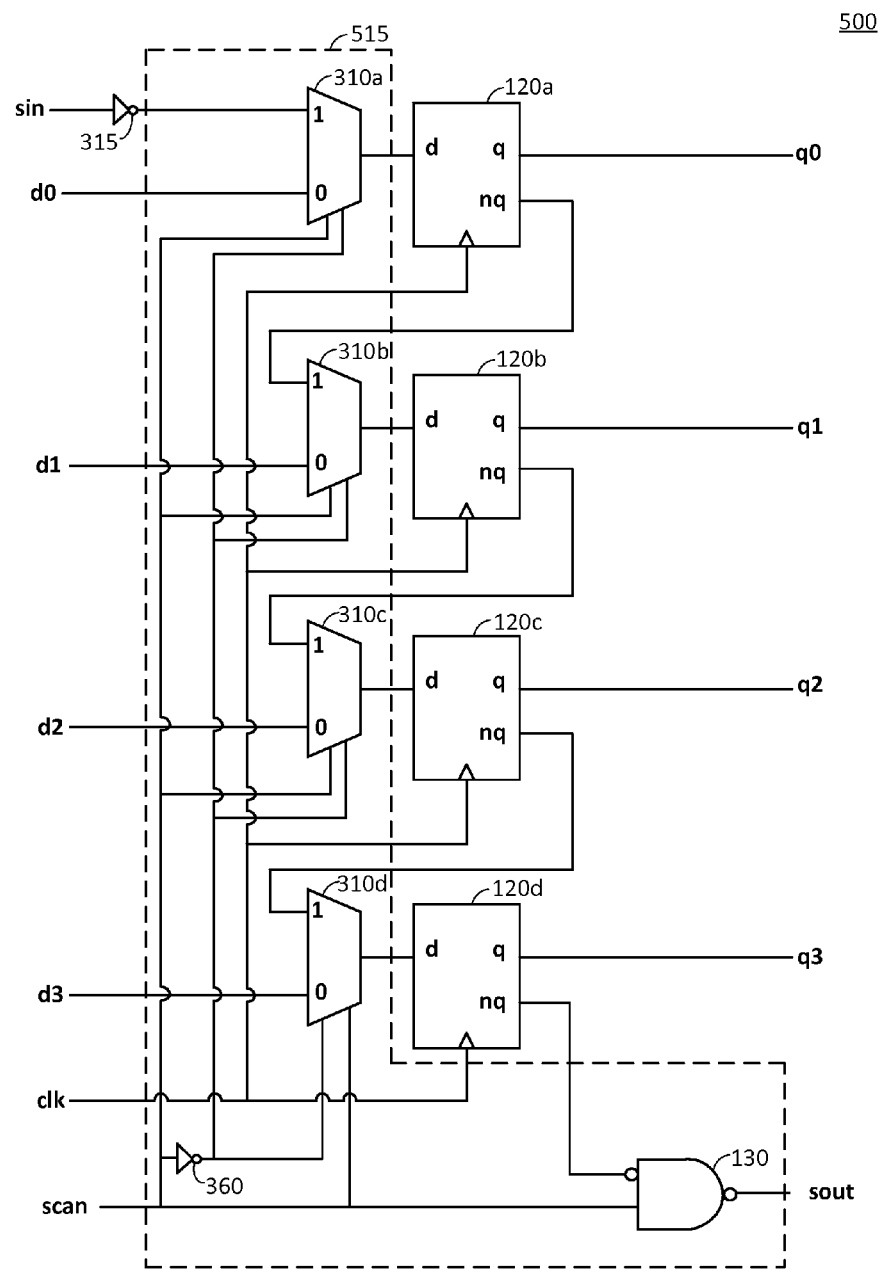
FIG. 5 shows a scannable flop tray according to an embodiment of the present disclosure.

FIG. 5 shows an example of a scannable flop tray 500, in which the scan circuitry 115 in FIG. 1 is replaced by scan circuitry 515 according to an embodiment of the present disclosure. The scan circuitry 515 comprises a first scan multiplexer 310a, a second scan multiplexer 310b, a third scan multiplexer 310c, and a fourth scan multiplexer 310d, in which each of the scan multiplexers 310a-310d is implemented using the scan multiplexer 310 shown in FIG. 3. The scan circuitry 515 also comprises the scan mode inverter 360, which is shared by the scan multiplexers 310a-310d. The scan mode inverter 360 provides each scan multiplexer 310a-310d with the inverse of the scan mode signal. The flop tray 500 also comprises the inverter 315 coupled between the scan input ("sin") of the flop tray 500 and the scan input (labeled "1") of the first scan multiplexer 310a.

The scan input (labeled "1") of the first scan multiplexer 310 is coupled to the inverter 315. The scan input (labeled "1") of each of the remaining scan multiplexers 310b-310d is coupled to the nq output of the previous D flip-flop 120a-120c without an intervening inverter. The data input (labeled "0") of each of the scan multiplexers 310a-310d is coupled to the respective data signal d0-d3, and the output of each of the scan multiplexers 310a-310d is coupled to the input of the respective flip-flop 120a-120d.

In the normal mode, each scan multiplexer 310a-310d inverts the respective data signal d0-d3 using the respective tri-state circuit 215, and outputs the inverted data signal to the input of the respective D flip-flop 120a-120d. Each D flip-flop 120a-120d captures a data value (e.g., a bit) from the respective data signal d0-d3 on a rising or falling edge of a clock signal clk, and outputs the captured data value q0-q3.

In the scan mode, the inverter 315 inverts the scan signal at the scan input ("sin") of the flop tray 500 to generate an inverted input scan signal. The first scan multiplexer 310a passes the inverted input scan signal to the input of the first D flip-flop 120a. Each of the remaining scan multiplexers 310b-310c couples the scan signal output from the previous flip-flop 120a-120c to the input of the respective flip-flop 120b-120d without inversion. The scan signal is finally output at the output of the NAND gate 130 (labeled "sout"). The output scan signal may be inverted or non-inverted relative to the input scan signal depending on the number of inversions in the scan path from the scan input ("sin") of the flop tray 500 to the scan output ("sout").

Thus, in the scan mode, a scan signal is scanned through the D flip-flops 120a-120d of the flop tray 500. The scan signal may comprise a known test pattern, and the functionality of the flop tray 500 may be evaluated by comparing the output scan signal from the flop tray 500 with an expected output scan signal based on the known test pattern. The expected output scan signal for the flop tray 500 in FIG. 5 may differ from the expected output scan signal for the flop tray 100 in FIG. 1 for a given test pattern. This is because the flop tray 500 in FIG. 5 has a different number of inversions in the scan path due to the fact that the scan multiplexers 310a-310d do not invert the scan signal.

Implementing each scan multiplexer 310a-310d of the flop tray 500 using the multiplexer 310 shown in FIG. 3 can lead to a significant reduction in the number of transistors in the flop tray 500. The first scan multiplexer 310a in the flop tray 500 may not contribute to a reduction in the number of transistors because of the inverter 315 coupled between the scan input ("sin") of the flop tray 500 and the first scan multiplexer 310a. However, each of the remaining scan multiplexers 310b-310d in the flop tray 500 reduces the transistor count by two. This is because, for each of the remaining scan multiplexers 310b-310d, the respective pass gate 320 uses two transistors compared with four transistors for the second tri-state circuit 220 shown in FIG. 2. For example, for a 4-bit flop tray (an example of which is shown in FIG. 5), this leads to a reduction of 6 transistors compared with the flop tray 100 in FIG. 1 (a reduction of two transistor for each of the three remaining multiplexers 310b-310d). For an 8-bit flop tray comprising 8 D flip-flops, this leads to a reduction of 14 transistors, and for a 16-bit flop tray comprising 16 D flip-flops, this leads to a reduction of 30 transistors. The reduction in the number of transistors in the scan circuitry 515 reduces the chip area taken up by the scan circuitry and reduces power consumption.

In order for each D flip-flop 120*a*-120*d* to properly capture a value from a signal (e.g., the respective data signal d0-d3 or scan signal) at its input, the value needs to stable for a period of time after a rising or falling edge of the clock clk (referred to as hold time). If the signal changes value during the hold time, then a hold time violation occurs and the flip-flop may enter into a metastable state. To prevent a hold time violation in the normal mode, the delay in the data path to the flip-flop may be adjusted to provide a sufficient hold time margin at the input of the flip-flop. The hold time margin may be the difference between an expected time for a change in the signal after the rising or falling edge of the clock clk and the hold time. A larger hold time margin improves the robustness of the flip-flop by providing a larger margin for process and operating variations.

In the scan mode, the hold time margin for each of the second, third and fourth flip-flops 120*b*-120*d* in FIG. 5 is reduced by approximately one inverter delay compared with the second, third and fourth flip-flops 120*b*-120*d* in FIG. 1. This is because each of the respective multiplexers 310*b*-310*d* in FIG. 5 does not invert the scan signal unlike the respective multiplexers 110*b*-110*d* in FIG. 1. However, even with the reduction in the hold time margin in the scan mode, the hold time margin may remain sufficiently large to prevent hold time violations during testing. For example, when each of the flip-flops 120*b*-120*d* is implemented using the flip-flop shown in FIG. 2, it has been found that the hold time margin in the scan mode remains large enough to prevent hold time violations. The hold time margin for the first flip-flop 120*a* may be approximately the same since the inverter 315 coupled to the first multiplexer 110*a* adds an inverter delay.

Referring back to FIG. 3, the first tri-state circuit 215 will now be described in more detail. The first tri-state circuit 215 is an example of a tri-state inverter, and comprises a first p-type transistor 330, a second p-type transistor 335, a first n-type transistor 350, and a second n-type transistor 340. The transistors 330, 335, 340 and 350 are stacked on top of one another between a power supply and ground. More particularly, the source of the first p-type transistor 330 is coupled to the power supply, the source of the second p-type transistor 335 is coupled to the drain of the first p-type transistor 330, the drain of the second n-type transistor 340 is coupled to the drain of the second p-type transistor 335, the drain of the first n-type transistor 350 is coupled to the source of the second n-type transistor 340, and the source of the first n-type transistor 350 is coupled to ground.

The gate of the first p-type transistor 330 is coupled to the scan mode input ("scan") and the gate of the first n-type transistor 350 is coupled to the scan mode input ("scan") through the scan mode inverter 360, which may be shared by the scan multiplexers 310*a*-310*d*, as shown in FIG. 5. Thus, the gate of the first p-type transistor 330 is driven by the scan mode signal, and the gate of the first n-type transistor 350 is driven by the inverse of the scan mode signal. The gates of the second p-type transistor 335 and the second n-type transistor 340 are coupled to the data input of the multiplexer 310.

When the scan mode signal is zero (normal mode), the first p-type transistor 330 and the first n-type transistor 350 are both turned on. As a result, the first p-type transistor 330 couples the source of the second p-type transistor 335 to the power supply, and the first n-type 350 couples the source of the second n-type transistor 340 to ground. This enables the second p-type transistor 335 and the second n-type transistor 340 to act as a complimentary inverter, in which the input of the inverter is located at the gates of the second p-type transistor 335 and the second n-type transistor 340, and the output of the inverter is located at the drains of the second p-type transistor 335 and the second n-type transistor 340. The inverter inverts the respective data signal and outputs the inverted data signal to the respective flip-flop.

When the scan mode signal is one (scan mode), the first p-type transistor 330 and the first n-type transistor 350 are both turned off. This disconnects the source of the second p-type transistor 335 from the power supply, and disconnects the source of the second n-type transistor 340 from ground. As a result, the respective data signal is blocked from the input of the respective flip-flop.

Figure 6:
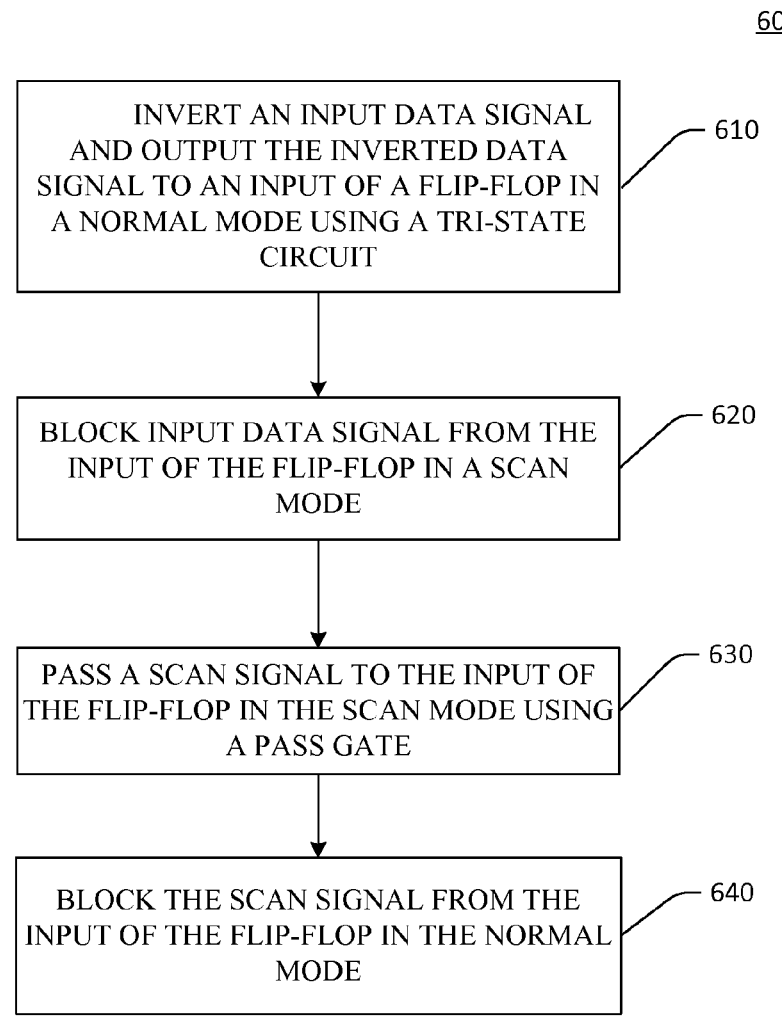
FIG. 6 is a flowchart illustrating a method for scanning a flop tray with reduced scan overhead according to certain embodiments of the present disclosure.

FIG. 6 is a flow diagram of a method 600 for scanning a flop tray with reduced scan overhead according to an embodiment of the present disclosure.

In step 610, an input data signal is inverted and outputted to an input of a flip-flop in a normal mode using a tri-state circuit. For example, step 610 may be performed using the tri-state circuit 215 in FIG. 3, in which the tri-state circuit 215 is operated in the normal mode by inputting a scan mode signal of zero to the scan mode input ("scan").

In step 620, the input data signal is blocked from the input of the flip-flop in a scan mode using the tri-state circuit. For example, step 620 may be performed using the tri-state circuit 215 in FIG. 3, in which the tri-state circuit 215 is operated in the scan mode by inputting a scan mode signal of one to the scan mode input ("scan").

In step 630, a scan signal is passed to the input of the flip-flop in the scan mode using a pass gate. For example, step 630 may be performed using the pass gate 320 in FIG. 3, in which the pass gate 320 is operated in the scan mode by inputting a scan mode signal of one to the scan mode input ("scan"). The pass gate 320 may be implemented using fewer transistors than a tri-state circuit, and therefore reduce the scan overhead.

In step 640, the scan signal is blocked from the input of the flip-flop in the normal mode using the pass gate. For example, step 640 may be performed using the pass gate 320 in FIG. 3, in which the pass gate 320 is operated in the normal mode by inputting a scan mode signal of zero to the scan mode input ("scan").

Those skilled in the art would appreciate that embodiments of the present disclosure are not limited to the examples described herein. For example, the scan input of a scan multiplexer may be coupled to the q output of the previous flip-flop instead of the nq output. Also, embodiments of the present disclosure may be used in flop trays comprising various types of flip-flops, and therefore are not limited to the exemplary flip-flop shown in FIG. 2. Further, embodiments of the present disclosure may be used in flop trays comprising any number of flip-flops, including, for example, two flip-flops, four flip-flops, 8 flip-flops, 16 flip-flops, etc.

Those skilled in the art would appreciate that the circuits described herein may be realized using a variety of transistor types, and are therefore not limited to the particular transistor types shown in the figures. For example, transistor types such as bipolar junction transistors, junction field effect transistor or any other transistor type may be used. Those skilled in the art would also appreciate that the circuits described herein may be fabricated with various IC process technologies such as CMOS, bipolar junction transistor (BJT), bipolar-CMOS (BiCMOS), silicon germanium (SiGe), gallium arsenide (GaAs), etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A scan circuit for a flop tray, comprising:
a scan mode input;
a tri-state circuit coupled to the scan mode input, wherein the tri-state circuit is configured to invert an input data signal and output the inverted data signal to an input of a flip-flop in response to the scan mode input being in a first logic state and to block the data signal from the input of the flip-flop of the flop tray in response to the scan mode input being in a second logic state; and
a pass gate coupled to the scan mode input, wherein the pass gate is configured to pass a scan signal to the input of the flip-flop in response to the scan mode input being in the second logic state, and to block the scan signal from the input of the flip-flop in response to the scan mode input being in the first logic state.

2. The scan circuit of claim 1, wherein the pass gate comprises:
an n-type transistor coupled to the scan mode input; and
a p-type transistor coupled in parallel with the n-type transistor and coupled to the scan mode input via an inverter, wherein the p-type transistor and the n-type transistor are configured to turn on in response to the scan mode input being in the second logic state, and to turn off in response to the scan mode input being in the first logic state.

3. The scan circuit of claim 1, further comprising an inverter coupled between a scan input of the flop tray and the pass gate.

4. The scan circuit of claim 1, wherein the pass gate is coupled between an output of another flip-flop of the flop tray and the input of the flip-flop.

5. The scan circuit of claim 4, wherein there is no inverter between the output of the other flip-flop and the pass gate.

6. The scan circuit of claim 1, wherein the first logic state is a logic zero state, and the second logic state is a logic one state.

7. A scan circuit for a flop tray, comprising:
a scan mode input;
a first tri-state circuit coupled to the scan mode input, wherein the first tri-state circuit is configured to invert a first data signal and output the inverted first data signal to an input of a first flip-flop of the flop tray in response to the scan mode input being in a first logic state, and to block the first data signal from the input of the first flip-flop in response to the scan mode input being in a second logic state;
a first pass gate coupled to the scan mode input, wherein the first pass gate is configured to pass a scan signal to the input of the first flip-flop in response to the scan mode input being in the second logic state, and to block the scan signal from the input of the first flip-flop in response to the scan mode input being in the first logic state;
a second tri-state circuit coupled to the scan mode input, wherein the second tri-state circuit is configured to invert a second data signal and output the inverted second data signal to an input of a second flip-flop of the flop tray in response to the scan mode input being in the first logic state, and to block the second data signal from the input of the second flip-flop in response to the scan mode input being in the second logic state; and
a second pass gate coupled to the scan mode input, wherein the second pass gate is configured to pass the scan signal from an output of the first flip-flop to the input of the second flip-flop in response to the scan mode input being in the second logic state, and to block the scan signal from the output of the first flip-flop from the input of the second flip-flop in response to the scan mode input being in the first logic state.

8. The scan circuit of claim 7, wherein there is no inverter between the output of the first flip-flop and the second pass gate.

9. The scan circuit of claim 7, further comprising an inverter coupled between a scan input of the flop tray and the first pass gate.

10. The scan circuit of claim 9, wherein there is no inverter between the output of the first flip-flop and the second pass gate.

11. The scan circuit of claim 7, wherein the second pass gate comprises:
an n-type transistor coupled to the scan mode input; and
a p-type transistor coupled in parallel with the n-type transistor and coupled to the scan mode input via an inverter, wherein the p-type transistor and the n-type transistor are configured to turn on in response to the scan mode input being in the second logic state, and to turn off in response to the scan mode input being in the first logic state.

12. The scan circuit of claim 7, wherein the first logic state is a logic zero state, and the second logic state is a logic one state.

13. A method for scanning a flop tray, comprising:
inverting an input data signal and outputting the inverted data signal to an input of a flip-flop of the flop tray in response to a scan mode input of the flop tray being in a first logic state using a tri-state circuit coupled to the scan mode input;
blocking the data signal from the input of the flip-flop in response to the scan mode input being in a second logic state using the tri-state circuit;
passing a scan signal to the input of the flip-flop in response to the scan mode input being in the second logic state using a pass gate coupled to the scan mode input; and
blocking the scan signal from the input of the flip-flop in response to the scan mode input being in the first logic state using the pass gate.

14. The method of claim 13, further comprising passing the scan signal output from the flip-flop to an input of another flip-flop of the flop tray in the scan mode using another pass gate.

15. The method of claim 14, wherein the scan signal output from the flip-flop is passed to the input of the other flip-flop without inverting the scan signal output from the flip-flop.

16. The method of claim 13, further comprising inverting the scan signal prior to passing the scan signal to the input of the flip-flop using the pass gate.

17. The method of claim 16, further comprising passing the scan signal output from the flip-flop to an input of another flip-flop of the flop tray in the scan mode using another pass gate.

18. The method of claim 17, wherein the scan signal output from the flip-flop is passed to the input of the other flip-flop without inverting the scan signal output from the flip-flop.

19. The method of claim 13, wherein the first logic state is a logic zero state, and the second logic state is a logic one state.

20. An apparatus for scanning a flop tray, comprising:
- means for inverting an input data signal and outputting the inverted data signal to an input of a flip-flop of the flop tray in response to a scan mode input of the flop tray being in a first logic state;
- means for blocking the data signal from the input of the flip-flop in response to the scan mode input being in a second logic state;
- means for passing a scan signal to the input of the flip-flop in response to the scan mode input being in the second logic state; and
- means for blocking the scan signal from the input of the flip-flop in response to the scan mode input being in the first logic state.

21. The apparatus of claim 20, further comprising means for passing the scan signal output from the flip-flop to an input of another flip-flop of the flop tray in the scan mode.

22. The apparatus of claim 21, wherein the scan signal output from the flip-flop is passed to the input of the other flip-flop without inverting the scan signal output from the flip-flop.

23. The apparatus of claim 20, further comprising means for inverting the scan signal prior to the means for passing the scan signal to the input of the flip-flop.

24. The apparatus of claim 23, further comprising means for passing the scan signal output from the flip-flop to an input of another flip-flop of the flop tray in the scan mode.

25. The apparatus of claim 24, wherein the scan signal output from the flip-flop is passed to the input of the other flip-flop without inverting the scan signal output from the flip-flop.

26. The apparatus of claim 20, wherein the first logic state is a logic zero state, and the second logic state is a logic one state.

* * * * *